US009647509B2

United States Patent
Mukunoki et al.

(10) Patent No.: US 9,647,509 B2
(45) Date of Patent: May 9, 2017

(54) COOLER AND MOTOR-INTEGRATED POWER CONVERSION APPARATUS

(75) Inventors: Yasushige Mukunoki, Tokyo (JP);
Takaharu Suzuki, Tokyo (JP);
Hidehito Yamauchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 556 days.

(21) Appl. No.: 14/123,838

(22) PCT Filed: Jul. 19, 2011

(86) PCT No.: PCT/JP2011/066338
§ 371 (c)(1),
(2), (4) Date: Dec. 4, 2013

(87) PCT Pub. No.: WO2013/011557
PCT Pub. Date: Jan. 24, 2013

(65) Prior Publication Data
US 2014/0125164 A1    May 8, 2014

(51) Int. Cl.
*H02K 9/00*  (2006.01)
*H02K 9/22*  (2006.01)
(Continued)

(52) U.S. Cl.
CPC .............. *H02K 9/00* (2013.01); *H02K 9/005* (2013.01); *H02K 9/22* (2013.01); *H02K 11/33* (2016.01); *H05K 7/20927* (2013.01); *H02M 7/48* (2013.01)

(58) Field of Classification Search
CPC .. H02K 9/00; H02K 9/14; H02K 9/16; H02K 9/18; H02K 9/19; H02K 9/193; F28D 7/00
(Continued)

(56) References Cited

U.S. PATENT DOCUMENTS 3,915,262 A * 10/1975 Klaue ............... B60T 1/062
                                                188/264 D
4,445,599 A *  5/1984 Bopp ................ F16D 35/00
                                                188/264 D
(Continued)

FOREIGN PATENT DOCUMENTS

JP   59 193053   11/1984
JP    7 112034   11/1995
(Continued)

OTHER PUBLICATIONS

International Search Report Issued on Aug. 30, 2011 in PCT/JP11/066338 Filed Jul. 19, 2011.

*Primary Examiner* — Quyen Leung
*Assistant Examiner* — Minki Chang
(74) *Attorney, Agent, or Firm* — Oblon, McClelland, Maier & Neustadt, L.L.P.

(57) ABSTRACT

A surface of a plate (102) having a predetermined thickness is used as a cooling surface (101). A pair of cooling medium entrance and exit (111, 112) are provided on one end surface (102a). First and second cooling medium flow paths (131, 132), a cooling medium branch path (121) communicating with the cooling medium entrance (111) and used for dividing cooling medium to flow into the cooling medium flow paths (131, 132), and a cooling medium merging path (122) at which the cooling media flowing from the exits of the cooling medium flow paths (131, 132) merge, are formed on a surface opposite to the cooling surface (101). The cooling medium flowing clockwise through the first cooling medium flow path (131) passes through a cooling medium communicating flow path (123) formed so as to three-dimensionally cross the first cooling medium flow path (131), so that the cooling medium flowing counterclockwise through the second cooling medium flow path (132) and the cooling medium flowing through the first cooling medium flow path (Continued)

(131) flow into the cooling medium merging path (122). Thus, pressure loss is avoided, high cooling performance is obtained, and simplification of a cooling system including a cooling medium pipe and the like can be realized.

4 Claims, 4 Drawing Sheets

(51) Int. Cl.
  *H02M 7/48* (2007.01)
  *H02K 7/20* (2006.01)
  *H02K 11/33* (2016.01)
  *H05K 7/20* (2006.01)

(58) Field of Classification Search
  USPC .................. 310/52, 54, 58, 59, 64; 165/164
  See application file for complete search history.

(56) References Cited

U.S. PATENT DOCUMENTS

| 5,890,983 | A  | * | 4/1999 | Kawahara | F16D 37/02 |
| | | | | | 188/264 D |
| 7,374,027 | B2 | * | 5/2008 | Mayberry | F16D 65/853 |
| | | | | | 188/264 CC |
| 2001/0018998 | A1 | * | 9/2001 | Drecq | F24J 3/00 |
| | | | | | 188/71.6 |
| 2010/0295391 | A1 | * | 11/2010 | Perkins | B60K 6/48 |
| | | | | | 310/64 |
| 2012/0274169 | A1 | * | 11/2012 | Saito | H02K 1/276 |
| | | | | | 310/156.53 |

FOREIGN PATENT DOCUMENTS

| JP | 08 097337 | 4/1996 |
| JP | 3975162 | 6/2007 |

* cited by examiner (a)

(b)

(a)

(b)

(a)

(b)

COOLER AND MOTOR-INTEGRATED POWER CONVERSION APPARATUS

TECHNICAL FIELD

The present invention relates to a cooler and a motor-integrated power conversion apparatus including the cooler, and particularly, to a cooler for performing cooling by a liquid as a cooling medium, e.g., water, flowing inside the cooler, and a motor-integrated power conversion apparatus using the cooler.

BACKGROUND ART

In a power conversion semiconductor device or a power conversion semiconductor module, large thermal loss occurs upon current application. Therefore, as a cooler, a liquid-cooling-type cooler is used which forcibly causes a cooling medium to flow from the outside, and various patterns of the cooling flow path are disclosed.

For example, a cooler for semiconductor device shown in Patent Document 1 has a lower cooling unit having a forward path portion formed in a whorl shape from the entrance for cooling water to a central portion, and a return path portion adjacent to the forward path portion, returning from the forward path portion to the exit for the cooling water, and an upper portion of the lower cooling unit is covered by an upper cooling unit, thereby realizing a cooler that can perform uniform cooling over the entire cooler.

In addition, in a cooler for electric component shown in Patent Document 2, a whorl-shaped flow path is divided into a plurality of paths, thereby realizing improvement in cooling performance.

In addition, a cooler for electronic apparatus shown in Patent Document 3 has multiple flow paths provided in a cooling plate, through which cooling media flow in directions alternately opposite to each other, thereby enabling uniform cooling.

In addition, in a motor-integrated inverter apparatus shown in Patent Document 4, a rear frame having a cooling water path formed thereon is provided between an electric motor and an inverter, thereby realizing a motor-integrated inverter apparatus with simplified wiring.

CITATION LIST

Patent Document

Patent Document 1: Japanese Examined Patent Publication No. 7-112034
Patent Document 2: Japanese Laid-Open Patent Publication No. 8-97337
Patent Document 3: Japanese Laid-Open Patent Publication No. 59-193053
Patent Document 4: Japanese Patent Publication No. 3975162

SUMMARY OF THE INVENTION

Problems to Be Solved by the Invention

In recent years, as a part of approach to environmental problems, marketing of hybrid electric vehicles (HEV) and electric vehicles (EV) is actively developed, and there is a high demand for power conversion semiconductor devices or power conversion semiconductor modules for driving a motor. In the case of HEV or EV, since there is restriction of the vehicle inside space as well as consideration of the cooling performance of the power conversion semiconductor device or the power conversion semiconductor module, a driving system with a small size and a simple configuration in which a motor and an inverter are integrated is required.

In the conventional examples shown in Patent Document 1 and Patent Document 2, the flow paths are formed in a whorl shape, and further, a plurality of flow paths including a pair of the cooling medium entrance and the cooling medium exit are all formed on the same plane. Therefore, it is inevitable that the flow path length becomes long and large pressure loss occurs. In this case, there is a problem that an external pump with a high performance is needed in order to improve the cooling performance.

In addition, in the conventional example shown in Patent Document 3, a plurality of entrances and exits for causing cooling media to flow in opposite directions need to be formed in the cooling plate, and therefore there is a problem that the arrangement of cooling medium pipes is complicated. In addition, due to the entrances and exits provided at a plurality of positions, there is a problem that a plurality of external pumps also need to be prepared.

Thus, in any of Patent Documents 1 to 3, there is a problem that the size of the cooler system including external pumps is large and its cost is high.

In addition, in the motor-integrated inverter apparatus shown in Patent Document 4, although the rear frame having a cooling performance is provided between the electric motor and the inverter, there is a problem that it is not assured that the cooling performance and simplification of the cooling system including cooling medium pipes are sufficient.

The present invention has been made to solve the above problems, and an object of the present invention is to provide a cooler that realizes both excellent cooling performance and a small-sized and simple configuration at the same time. In addition, another object of the present invention is to provide a motor-integrated power conversion apparatus including the cooler, thereby having excellent cooling performance, a small size, and a simple configuration.

Solution to the Problems

A cooler according to the present invention includes: a cooler base body having a predetermined thickness and a planar shape, a surface thereof serving as a cooling surface; a pair of a cooling medium entrance and a cooling medium exit formed so as to open on an outer side surface of the cooler base body; and a cooling medium branch path communicating with the cooling medium entrance, a cooling medium merging path communicating with the cooling medium exit, and a plurality of cooling medium flow paths communicating with the cooling medium branch path, which are formed inside the cooler base body. One of the plurality of cooling medium flow paths allows the cooling medium branch path and the cooling medium merging path to communicate with each other. The cooling medium flow paths other than the one cooling medium flow path allow the cooling medium branch path and the cooling medium merging path to communicate with each other via a cooling medium communicating flow path which is formed, so as to three-dimensionally cross the cooling medium flow paths, on a plane shifted in a direction of the thickness from a plane on which the cooling medium flow paths are formed. The plurality of cooling medium flow paths are provided such that flowing directions of cooling media flowing in the adjacent cooling medium flow paths among the plurality of cooling medium flow paths are opposite to each other.

A motor-integrated power conversion apparatus according to the present invention includes: an electric motor including an electric motor shaft and an electric motor bracket having a flat surface perpendicular to the electric motor shaft and supporting the electric motor shaft in a rotatable state; a power conversion semiconductor device or a power conversion semiconductor module for controlling the electric motor; and a cooler including: a cooler base body having a predetermined thickness and a planar shape, a surface thereof serving as a cooling surface; a pair of a cooling medium entrance and a cooling medium exit formed so as to open on an outer side surface of the cooler base body; and a cooling medium branch path communicating with the cooling medium entrance, a cooling medium merging path communicating with the cooling medium exit, and a plurality of cooling medium flow paths communicating with the cooling medium branch path, which are formed inside the cooler base body. One of the plurality of cooling medium flow paths allows the cooling medium branch path and the cooling medium merging path to communicate with each other. The cooling medium flow paths other than the one cooling medium flow path allow the cooling medium branch path and the cooling medium merging path to communicate with each other via a cooling medium communicating flow path which is formed, so as to three-dimensionally cross the cooling medium flow paths, on a plane shifted in a direction of the thickness from a plane on which the cooling medium flow paths are formed. The plurality of cooling medium flow paths are provided such that flowing directions of cooling media flowing in the adjacent cooling medium flow paths among the plurality of cooling medium flow paths are opposite to each other. The cooler base body has a through hole formed therein, through which the electric motor shaft penetrates. One surface of the cooler base body is fixed on the electric motor bracket, and the power conversion semiconductor device or the power conversion semiconductor module is fixed on the other surface of the cooler base body.

Effect of the Invention

According to the cooler of the present invention, it is possible to avoid pressure loss, obtain high cooling performance, and realize simplification of a cooling system including cooling medium pipes and the like.

According to the motor-integrated power conversion apparatus of the present invention, it is possible to obtain a motor-integrated power conversion apparatus with a small size and a simple configuration in which the cooler is integrated with the electric motor bracket and the electric motor in high density, while realizing high cooling performance of the cooler.

DESCRIPTION OF EMBODIMENTS

Embodiment 1

Figure 1:
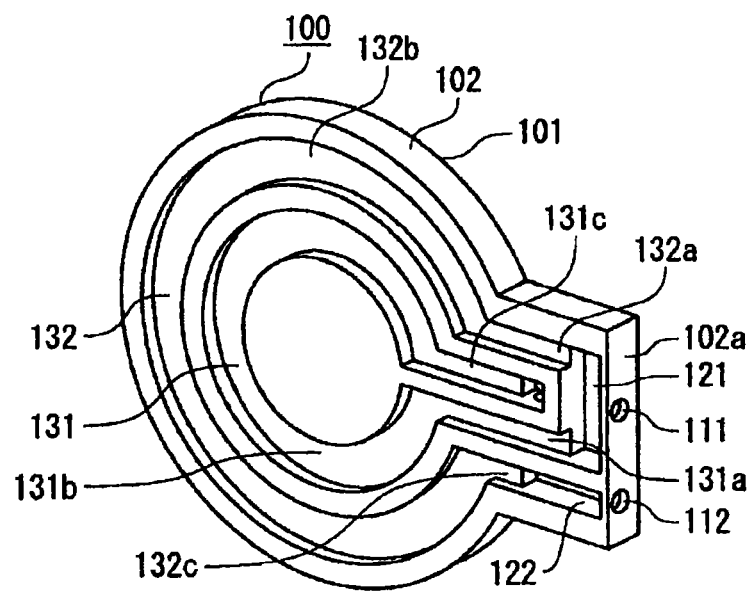
FIG. 1 is a perspective view and a front view showing embodiment 1 of a cooler according to the present invention.
Figure 1:
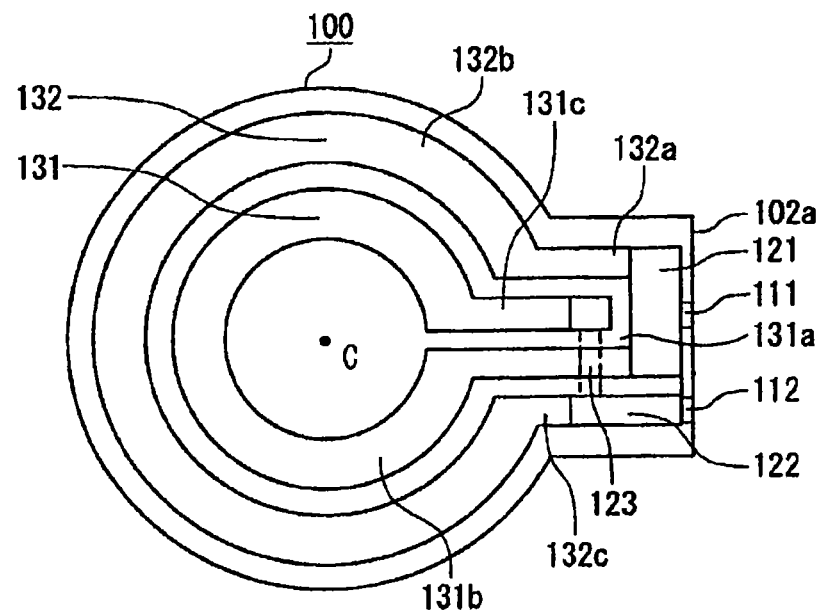

FIGS. 1(a) and 1(b) are a perspective view and a front view showing embodiment 1 of a cooler according to the present invention. A cooler 100 according to the present invention includes a cooler base body having a predetermined thickness and a planar shape, a surface thereof serving as a cooling surface. FIG. 1 is a diagram showing the configuration of a flow path formed inside the cooler base body, through which a cooling medium flows. As shown in FIG. 1, a cooling medium entrance 111 and a cooling medium exit 112 are formed which open on one end surface 102a which is an outer side surface of the cooler 100. On the same plane opposite to a cooling surface 101 of a plate 102, a first cooling medium flow path 131 and a second cooling medium flow path 132 through which cooling media flow are formed concentrically around a central axis C. Between the cooling medium entrance 111 and ends of the first cooling medium flow path 131 and the second cooling medium flow path 132, a cooling medium branch path 121 is formed for dividing a cooling medium flowing from the cooling medium entrance 111, to cause the divided cooling media to flow into the first cooling medium flow path 131 and the second cooling medium flow path 132. On the cooling medium exit 112 side, a cooling medium merging path 122 is formed at which cooling media flowing out from the other ends of the first cooling medium flow path 131 and the second cooling medium flow path 132, merge. The other end of the first cooling medium flow path 131 communicates with the cooling medium merging path 122 via a cooling medium communicating flow path 123 which is formed, so as to three-dimensionally cross the first cooling medium flow path 131, on a plane shifted in the thickness direction of the plate from the plane on which the first cooling medium flow path 131 and the second cooling medium flow path 132 are formed.

That is, the second cooling medium flow path 132 allows the cooling medium branch path 121 and the cooling medium merging path 122 to communicate with each other, and the first cooling medium flow path 131 allows the cooling medium branch path 121 and the cooling medium merging path 122 to communicate with each other via the cooling medium communicating flow path 123 which is formed, so as to three-dimensionally cross the cooling medium flow path, on the plane shifted in the thickness direction from the plane on which the cooling medium flow paths are formed.

Next, specific examples of the first cooling medium flow path 131 and the second cooling medium flow path 132 will be described. Here, for convenience sake in explanation, a term "groove" is used for each flow path.

The first cooling medium flow path 131 is composed of a first groove 131a communicating with the cooling medium branch path 121, a second groove 131b formed in an arc shape and communicating with the first groove 131a, and a third groove 131c communicating with the second groove 131b. In addition, the cooling medium communicating flow path 123 which communicates with the third groove 131c and communicates with the cooling medium merging path 122 is formed so as to three-dimensionally cross the first cooling medium flow path 131.

The second cooling medium flow path 132 is composed of a fourth groove 132a which is formed along the outer side of the third groove 131c of the first cooling medium flow path 131 and communicates with the cooling medium branch path 121, a fifth groove 132b which communicates with the fourth groove 132a and is formed along the outer side of the second groove 131b, and a sixth groove 132c which communicates with the fifth groove 132b, is formed along the outer side of the first groove 131a, and communicates with the cooling medium merging path 122.

In FIG. 1, a low-temperature cooling medium flowing from the cooling medium entrance 111 branches at the cooling medium branch path 121, and the branched cooling media flow in directions opposite to each other through the first cooling medium flow path 131 on the inner side and the second cooling medium flow path 132 on the outer side, thereby cooling a power conversion semiconductor device or a power conversion semiconductor module provided on the cooling surface 101. The cooling medium flowing from the second cooling medium flow path 132 on the outer side and the cooling medium flowing from the first cooling medium flow path 131 merge at the cooling medium merging path 122, to flow out through the cooling medium exit 112. Although the temperatures of the cooling media increase from a low temperature to a high temperature during a cooling process, the cooling medium flowing through the first cooling medium flow path 131 and the cooling medium flowing through the second cooling medium flow path 132 flow in directions opposite to each other, whereby the cooler 100 having a uniform cooling performance over the entire cooling surface 101 can be obtained.

According to the present embodiment 1, the cooling medium communicating flow path 123 crossing the first cooling medium flow path 131 is provided on a plane shifted in the thickness direction of the plate from the plane on which the first cooling medium flow path 131 and the second cooling medium flow path 132 are formed, so that the cooling medium flowing from the other end of the first cooling medium flow path 131 flows into the cooling medium merging path 122 via the cooling medium communicating flow path 123, whereby the flow path length can be shortened and pressure loss can be reduced. In addition, since the cooling medium flowing through the first cooling medium flow path 131 and the cooling medium flowing through the second cooling medium flow path 132 flow in directions opposite to each other, the cooler 100 having a uniform and high cooling performance over the entire cooling surface 101 can be obtained. In addition, since only one pair of the cooling medium entrance 111 and the cooling medium exit 112 are provided, for example, external cooling medium connection parts such as a nipple which is a connection part can be decreased to only one pair, and also the flow path length can be shortened, whereby occurrence of pressure loss can be suppressed.

In addition, only a pair of cooling medium pipes are sufficient and only one pump provided outside works sufficiently. Therefore, it is possible to construct a simple cooling system and realize simplification and cost reduction in the entire cooling system.

Embodiment 2

Figure 2:
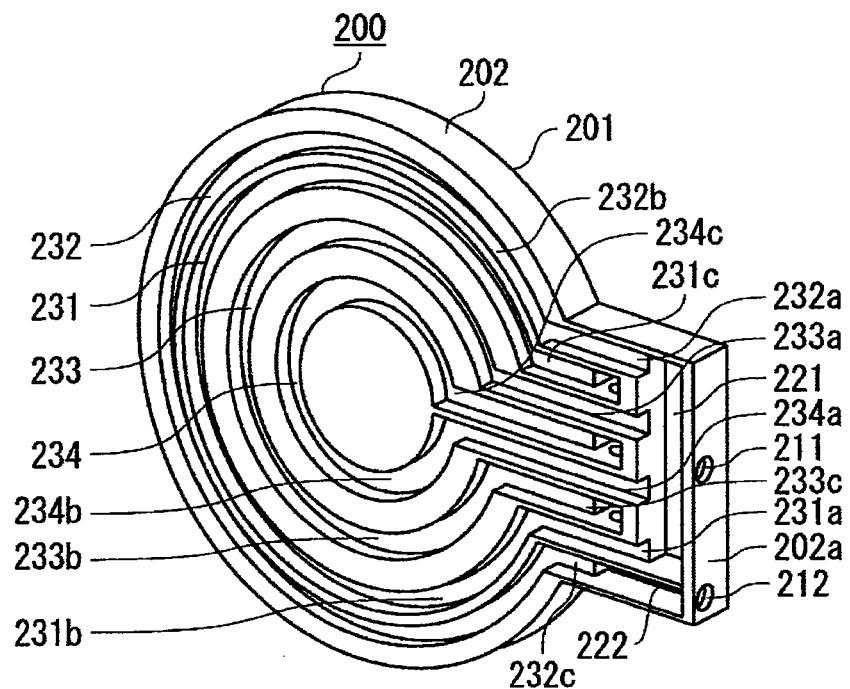
FIG. 2 is a perspective view and a front view showing embodiment 2 of a cooler according to the present invention.
Figure 2:
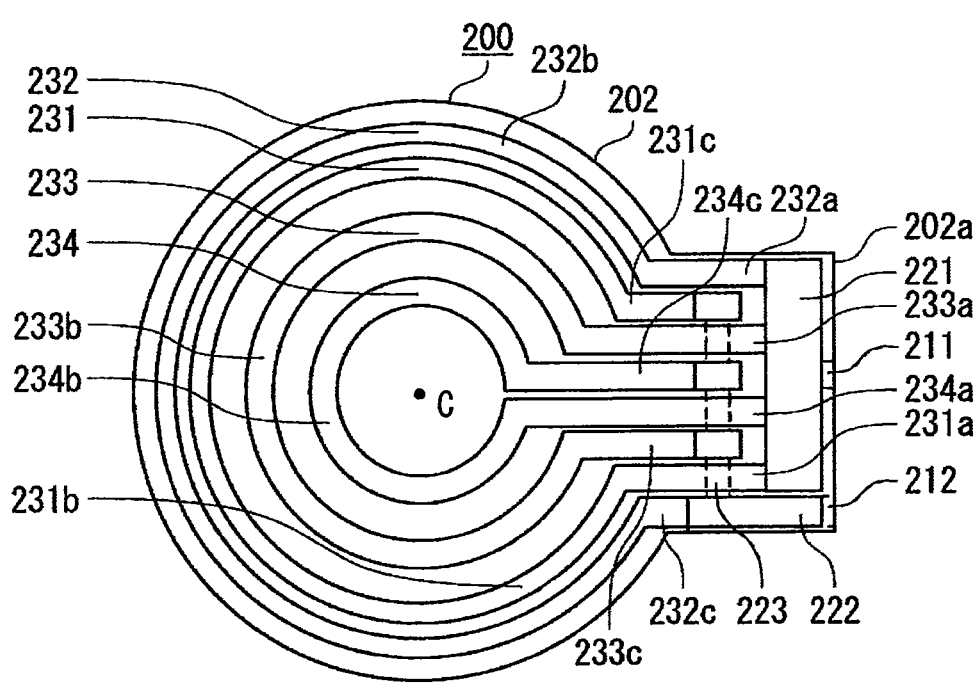

FIGS. 2(a) and 2(b) are a perspective view and a front view showing embodiment 2 of a cooler according to the present invention, and showing the configuration of a flow path through which a cooling medium flows. As shown in FIG. 2, a pair of a cooling medium entrance 211 and a cooling medium exit 212 are formed on one end surface 202a which is an outer side surface of a cooler base body of a cooler 200. On the same plane opposite to a cooling surface 201 of a plate 202, a first cooling medium flow path 231, a second cooling medium flow path 232, a third cooling medium flow path 233, and a fourth cooling medium flow path 234 through which cooling media flow are formed concentrically around a central axis C. Between the cooling medium entrance 211 and ends of the first cooling medium flow path 231 to the fourth cooling medium flow path 234, a cooling medium branch path 221 is formed for dividing a cooling medium flowing from the cooling medium entrance 211, to cause the divided cooling media to flow into the first cooling medium flow path 231, the one end 232a of the second cooling medium flow path 232, the third cooling medium flow path 233, and the fourth cooling medium flow path 234. On the cooling medium exit 212 side, a cooling medium merging path 222 is formed which communicates with the other ends of the first cooling medium flow path 231, the second cooling medium flow path 232, the third cooling medium flow path 233, and the fourth cooling medium flow path 234. The other end 232a of the second cooling medium flow path 232 directly communicates with the cooling medium merging path 222, and the other ends of the cooling medium flow paths 231, 233, and 234 other than the second cooling medium flow path 232 communicate with the cooling medium merging path 222 via the cooling medium communicating flow path 223 which is formed, so as to three-dimensionally cross the first cooling medium flow path 231, the third cooling medium flow path 233, and the fourth cooling medium flow path 234, on a plane shifted in the thickness direction of the plate from the plane on which the first cooling medium flow path 231 to the fourth cooling medium flow path 234 are formed.

That is, the second cooling medium flow path 232 allows the cooling medium branch path 221 and the cooling medium merging path 222 to communicate with each other, and the cooling medium flow paths 231, 233, and 234 other than the second cooling medium flow path 232 allow the cooling medium branch path 221 and the cooling medium merging path 222 to communicate with each other via the cooling medium communicating flow path 223 formed so as to three-dimensionally cross the first cooling medium flow path 231, the third cooling medium flow path 233, and the fourth cooling medium flow path 234.

A difference from the above embodiment 1 is that the third cooling medium flow path 233 is formed along the inner side of the first cooling medium flow path 231, and the fourth cooling medium flow path 234 is formed along the third cooling medium flow path 233.

Next, specific examples of the third cooling medium flow path 233 and the fourth cooling medium flow path 234 will be described. Here, for convenience sake in explanation, a term "groove" is used for each flow path.

The third cooling medium flow path 233 is composed of a seventh groove 233a which communicates with the cooling medium branch path 221 and is formed along the inner side of a third groove 231c, an eighth groove 233b which communicates with the seventh groove 233a and is formed along the inner side of a second groove 231b, and a ninth groove 233c which communicates with the eighth groove 233b and is formed along the inner side of a first groove 231a. In addition, the cooling medium communicating flow path 223 which communicates with the ninth groove 233c and communicates with the cooling medium merging path 222 is formed so as to three-dimensionally cross the first groove 231a, the seventh groove 233a, and a tenth groove 234a. The ninth groove 233c communicates with the cooling medium merging path 222 via the cooling medium communicating flow path 223.

The fourth cooling medium flow path 234 is composed of the tenth groove 234a which communicates with the cooling medium branch path 221 and is formed along the inner side of the ninth groove 233c, an eleventh groove 234b which communicates with the tenth groove 234a and is formed along the inner side of the eighth groove 233b, and a twelfth groove 234c which communicates with the eleventh groove 234b and is formed along the inner side of the seventh groove 233a. The twelfth groove 234c communicates with the cooling medium merging path 222 via the cooling medium communicating flow path 223.

In FIG. 2, a low-temperature cooling medium flowing from the cooling medium entrance 211 branches at the cooling medium branch path 221 into respective ends on one side of the first to fourth cooling medium flow paths 231 to 234, and the branched cooling media flow through the first to fourth cooling medium flow paths 231 to 234 in directions alternately opposite between the adjacent flow paths, thereby cooling a power conversion semiconductor device or a power conversion semiconductor module provided on the cooling surface 201. The cooling medium flowing through the second cooling medium flow path 232 and then flowing out from its end 232c directly flows into the cooling medium merging path 222. The cooling media flowing from the first cooling medium flow path 231, the third cooling medium flow path 233, and the fourth cooling medium flow path 234 flow into the cooling medium merging path 222 via the cooling medium communicating flow path 223, to merge with the cooling medium flowing from the second cooling medium flow path 232 and then flow out through the cooling medium exit 212. Although the temperatures of the cooling media increase from a low temperature to a high temperature during a cooling process, the cooling media flowing through the first to fourth cooling medium flow paths 231 to 234 flow in directions opposite to each other between the adjacent cooling medium flow paths, whereby the cooler 200 having a uniform cooling performance over the entire cooling surface 201 can be obtained.

According to the present embodiment 2, the cooling medium communicating flow path 223 is formed so as to three-dimensionally cross the first cooling medium flow path 231, the third cooling medium flow path 233, and the fourth cooling medium flow path 234, whereby the flow path length can be shortened and pressure loss can be reduced. In addition, since the cooling media flowing through the first to fourth cooling medium flow paths 231, 232, 233, and 234 flow in directions opposite to each other between the adjacent cooling medium flow paths, the cooler 200 having a uniform cooling performance over the entire cooling surface 201 can be obtained. In addition, since only one pair of the cooling medium entrances 211 and the cooling medium exit 212 are provided, for example, external cooling medium connection parts such as a nipple which is a connection part need not be provided more than necessary, and also the flow path length can be shortened, whereby occurrence of pressure loss can be suppressed.

In addition, only a pair of cooling medium pipes are sufficient and only one pump provided outside works sufficiently. Therefore, it is possible to construct a simple cooling system and obtain a cooler allowing simplification and cost reduction in the entire cooling system.

In the above embodiments 1 and 2, the case of providing an even number (e.g., two or four) of cooling medium flow paths have been shown. However, an odd number (e.g., three) of cooling medium flow paths may be provided, or four or more cooling medium flow paths may be provided. In the case of odd number, the cooling performance of the cooler can be uniformed over the entire cooling surface by changing the groove widths of the cooling medium flow paths.

In addition, as an example, FIG. 2 has shown the case where the shapes of the second groove 231b, the fifth groove 232b, the eighth groove 233b, and the eleventh groove 234b are a concentrically-formed arc shape. However, instead of such an arc, various shapes such as concentrically-formed quadrangles may be employed.

In addition, in the above embodiments 1 and 2, for the cooling medium entrance 111 and the cooling medium exit 112 or the cooling medium entrance 211 and the cooling medium exit 212, the entrance and the exit may be inversed, so that cooling medium merging path 122 or 222 may be changed to a cooling medium branch path and the cooling medium branch path 121 or 221 may be changed to a cooling medium merging path.

Embodiment 3

Figure 3:
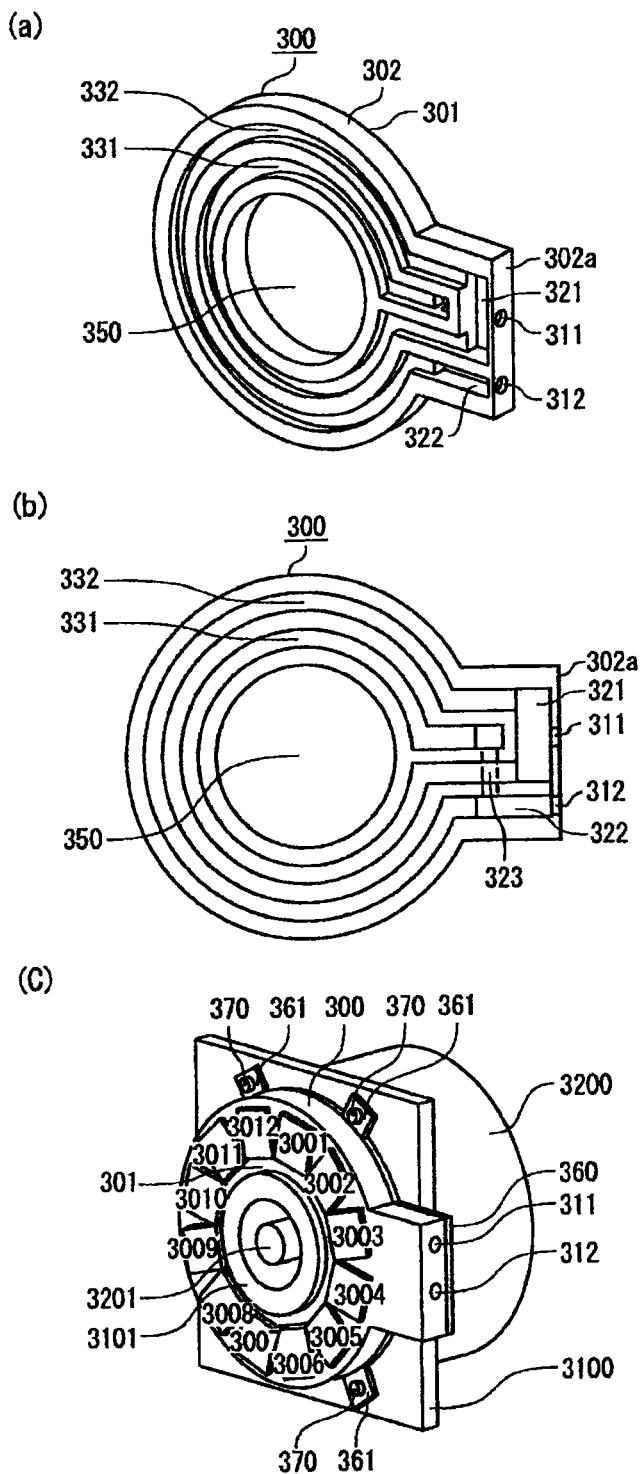
FIG. 3 is a perspective view and a front view showing embodiment 3 in which a cooler is applied to a motor-integrated power conversion apparatus, according to the present invention.

FIG. 3 is a diagram showing a motor-integrated power conversion apparatus according to the present invention. Specifically, FIGS. 3(a) and 3(c) are perspective views and FIG. 3(b) is a front view. It is noted that in FIG. 3(c), a cooler 300, an electric motor bracket 3100, and an electric motor 3200 are drawn such that the cooling surface 301 faces to the front side.

As shown in FIG. 3, the cooler 300 is almost the same as that shown in the above embodiment 1, as an example. Thus, as in the above embodiment 1 it has a cooling medium entrance 311 and a cooling medium exit 312 which open on one end surface 302a of a plate 302. Similarly, between the cooling medium entrance 311 and ends of the first cooling medium flow path 331 and the second cooling medium flow path 332, a cooling medium branch path 321 is formed for dividing a cooling medium flowing from the cooling medium entrance 311. On the cooling medium exit 312 side, a cooling medium merging path 322 is formed, and a cooling medium communicating flow path 323 three-dimensionally crosses the first cooling medium flow path 331 on a plane shifted in the thickness direction of the plate from the plane on which the first cooling medium flow path 331 and the second cooling medium flow path 332 are formed.

A difference from the above embodiment 1 is that a through hole 350 through which an electric motor shaft 3201 penetrates is formed on the central axis of arcs of a first cooling medium flow path 331 and a second cooling medium flow path 332 of the cooler 300, and power conversion semiconductor devices or power conversion semiconductor modules 3001 to 3012 for controlling the electric motor 3200 are fixed on the cooling surface 301.

As shown in FIG. 3(c), the motor-integrated power conversion apparatus of the present invention includes the electric motor 3200 including the electric motor shaft 3201 and the electric motor bracket 3100 having a flat surface perpendicular to the electric motor shaft 3201 and supporting the electric motor shaft 3201 in a rotatable state. The electric motor bracket 3100 has a cylindrical protrusion portion 3101 which allows the electric motor shaft 3201 to be placed on the inner circumferential side thereof. In addition, the power conversion semiconductor devices or power conversion semiconductor modules 3001 to 3012 are fixed on one surface, i.e., the cooling surface 301 of the cooler 300, and a lid 360 is provided on the other surface. An attachment screw table 361 is provided on the lid 360. The protrusion portion 3101 of the electric motor bracket 3100 is fitted into the through hole 350, and the cooler 300 is fixed on the electric motor bracket 3100 by a screw 370. Since the protrusion portion 3101 has a cylindrical shape, the protrusion portion 3101 is allowed to directly access the electric motor shaft 3201 placed on the inner circumferential side of the cylinder.

According to the present embodiment 3, it is possible to obtain a motor-integrated power conversion apparatus with a small size and a simple configuration in which the cooler 300 is integrated with the electric motor bracket 3100 and the electric motor 3200 in high density, while realizing high cooling performance of the cooler 300.

In the present embodiment 3, the case of using the cooler 300 that is almost the same as in the above embodiment 1 has been shown. However, the cooler 200 shown in embodiment 2 may be used. In this case, the through hole provided in the cooler 200 may be formed on the central axis of the arc of the fourth cooling medium flow path 234 formed on the innermost circumference.

Embodiment 4

Figure 4:
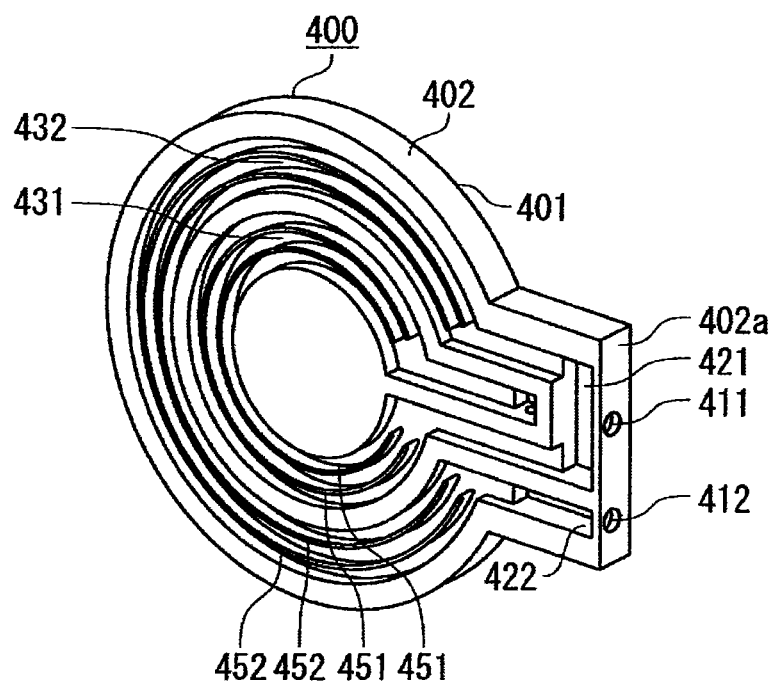
FIG. 4 is a perspective view and a front view showing embodiment 4 of a cooler according to the present invention.
Figure 4:
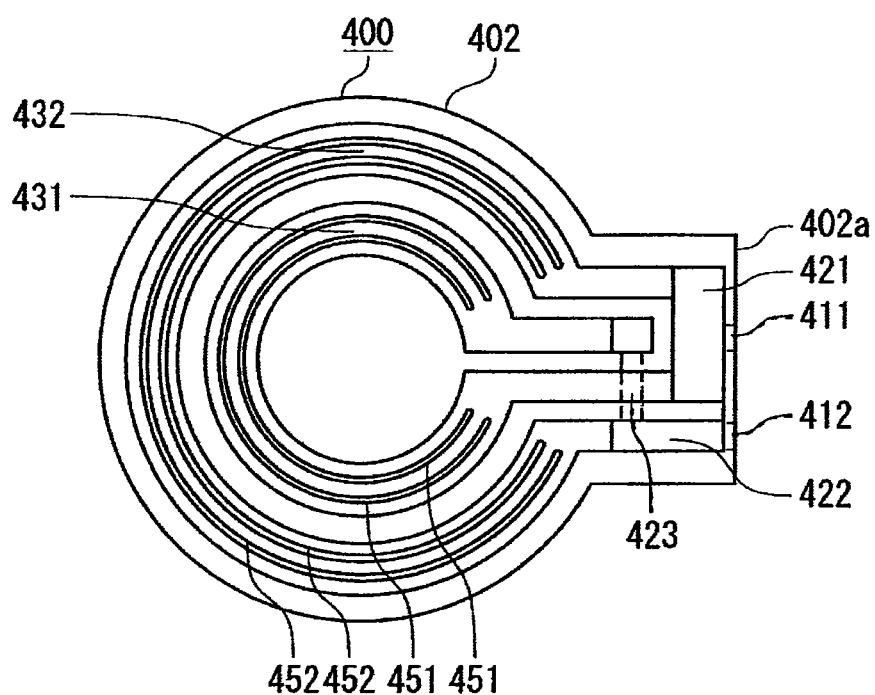

FIGS. 4(a) and 4(b) are a perspective view and a front view showing embodiment 4 of a cooler according to the present invention. As shown in FIG. 4, a cooler 400 is almost the same as that shown in the above embodiment 1, as an example. Thus, as in the above embodiment 1 it has a cooling medium entrance 411 and a cooling medium exit 412 which open on one end surface 402a of a plate 402 having a cooling surface 401. Similarly, between the cooling medium entrance 411 and ends of the first cooling medium flow path 431 and the second cooling medium flow path 432, a cooling medium branch path 421 is formed for dividing a cooling medium flowing from the cooling medium entrance 411. On the cooling medium exit 412 side, a cooling medium merging path 422 is formed, and a cooling medium communicating flow path 423 three-dimensionally crosses the first cooling medium flow path 431 on a plane shifted in the thickness direction of the plate from the plane on which the first cooling medium flow path 431 and the second cooling medium flow path 432 are formed. A difference from the above embodiment 1 is that a fin 451 extending in the flowing direction of a cooling medium is formed standing on a first cooling medium flow path 431, and a fin 452 extending in the flowing direction of a cooling medium is formed standing on a second cooling medium flow path 432. The fins 451 and 452 can be also applied to the cooling medium flow paths of the above embodiment 2.

According to the present embodiment 4, since the fin 451 is provided on the first cooling medium flow path 431 and the fin 452 is provided on the second cooling medium flow path 432, a cooler with high cooling performance can be obtained.

INDUSTRIAL APPLICABILITY

The cooler and the motor-integrated power conversion apparatus according to the present invention can be effectively utilized for an electric motor for vehicle such as an automobile or a train.

The invention claimed is:

1. A cooler comprising:
a cooler base body having a planar surface serving as a cooling surface and a predetermined thickness in a direction perpendicular to the planar surface;
a plurality of cooling medium flow paths formed in the cooler base body and extending in a plane parallel to the surface serving as the cooling surface;
a cooling medium entrance opening on an outer side surface of the cooler base body;
a cooling medium branch path communicating the cooling medium entrance with respective first ends of each of the cooling medium flow paths;
a cooling medium exit opening on the outer side surface of the cooler base body;
a cooling medium merging path communicating the cooling medium exit with a second end of a first of the cooling medium flow paths, wherein the second end of a second of the cooling medium flow paths is located between the first end of the first of the cooling medium flow paths and the first end of the second of the cooling medium flow paths; and
a cooling medium communicating flow path connecting the second end of the second of the cooling medium flow paths with the cooling medium merging path, wherein the cooling medium communicating flow path crosses the second of the cooling medium flow paths at a plane which is shifted in the thickness direction from the plane of the cooling medium flow paths,
wherein the plurality of cooling medium flow paths are arranged in the cooler base body such that a cooling medium flowing from the first end to the second end of the respective cooling medium flow paths flows in mutually opposite directions through the first and the second of the cooling medium flow paths.

2. The cooler according to claim 1, further comprising a fin extending in the flowing direction of the cooling medium.

3. A motor-integrated power conversion apparatus comprising:
an electric motor including an electric motor shaft and an electric motor bracket having a flat surface perpendicular to the electric motor shaft and supporting the electric motor shaft in a rotatable state;
a power conversion semiconductor device or a power conversion semiconductor module for controlling the electric motor; and
a cooler including:
a cooler base body having a planar surface serving as a cooling surface and a predetermined thickness in a direction perpendicular to the planar surface;
a plurality of cooling medium flow paths formed in the cooler base body and extending in a plane parallel to the surface serving as the cooling surface;
a cooling medium entrance opening on an outer side surface of the cooler base body;
a cooling medium branch path communicating the cooling medium entrance with respective first ends of each of the cooling medium flow paths;
a cooling medium exit opening on the outer side surface of the cooler base body;
a cooling medium merging path communicating the cooling medium exit with a second end of a first of the cooling medium flow paths, wherein the second end of a second of the cooling medium flow paths is located between the first end of the first of the cooling medium flow paths and the first end of the second of the cooling medium flow paths; and
a cooling medium communicating flow path connecting the second end of the second of the cooling medium flow paths with the cooling medium merging path, wherein the cooling medium communicating flow path crosses the second of the cooling medium flow paths at a plane which is shifted in the thickness direction from the plane of the cooling medium flow paths, wherein the plurality of cooling medium flow paths are arranged in the cooler base body such that a cooling medium flowing from the first end to the second end of the respective cooling medium flow paths flows in mutually opposite directions through the first and the second of the cooling medium flow paths, and wherein the cooler base body has a through hole formed therein, through which the electric motor shaft penetrates, one surface of the cooler base body is fixed on the electric motor bracket, and the power conversion semiconductor device or the power conversion semiconductor module is fixed on the other surface of the cooler base body.

4. The motor-integrated power conversion apparatus according to claim 3, further comprising a fin extending in the flowing direction of the cooling medium.

\* \* \* \* \*